(12) United States Patent
Tsai

(10) Patent No.: US 10,334,673 B2
(45) Date of Patent: Jun. 25, 2019

(54) LIGHTING SYSTEM

(71) Applicant: DA LIANG TECHNIQUE INDUSTRY LIMITED COMPANY, Taipei (TW)

(72) Inventor: Kuei-Ming Tsai, Taipei (TW)

(73) Assignee: DA LIANG TECHNIQUE INDUSTRY LIMITED COMPANY, Taipei (TW)

(*) Notice: Subject to any disclaimer, the term of this patent is extended or adjusted under 35 U.S.C. 154(b) by 0 days.

(21) Appl. No.: 16/042,868

(22) Filed: Jul. 23, 2018

(65) Prior Publication Data
US 2019/0037656 A1   Jan. 31, 2019

(30) Foreign Application Priority Data
Jul. 26, 2017  (TW) .............................. 106125026 A

(51) Int. Cl.
  *H05B 33/08*  (2006.01)
  *H01L 23/552*  (2006.01)
(52) U.S. Cl.
  CPC ....... *H05B 33/0818* (2013.01); *H01L 23/552* (2013.01); *H05B 33/0815* (2013.01); *H05B 33/0851* (2013.01)
(58) Field of Classification Search
  CPC ............ H05B 33/0809; H05B 33/0815; H05B 33/0833; H05B 33/0839; H05B 33/0845; H05B 33/0851
  USPC ................... 315/186, 224, 274, 307
  See application file for complete search history.

(56) References Cited

U.S. PATENT DOCUMENTS

| | | | |
|---|---|---|---|
| 8,203,288 B2* | 6/2012 | Lee ..................... | H05B 33/0818 315/209 R |
| 2011/0309758 A1 | 12/2011 | Yu et al. | |
| 2013/0128627 A1* | 5/2013 | Moon ............... | H02M 3/33507 363/21.17 |
| 2015/0195878 A1* | 7/2015 | Garrity .............. | H05B 33/0815 315/186 |
| 2016/0242247 A1* | 8/2016 | Wang ................. | H05B 33/0845 |
| 2017/0079098 A1 | 3/2017 | Mitterbacher et al. | |

OTHER PUBLICATIONS

The Search Report issued to European counterpart application No. 18185398.7 by the EPO dated Sep. 7, 2018.

* cited by examiner

*Primary Examiner* — Tung X Le
(74) *Attorney, Agent, or Firm* — Hamre, Schumann, Mueller & Larson, P.C.

(57) ABSTRACT

A lighting system includes: at least one lamp each including an LED unit; and a power converting device disposed outside of each lamp, and including a first EMI filter, a power converter and a second EMI filter. The first EMI filter is for receiving an AC input voltage from an AC power source, and filters the AC input voltage to generate a filtered voltage. The power converter is for receiving the filtered voltage from the first EMI filter, and performs AC to DC conversion on the filtered voltage to generate a converted voltage. The second EMI filter is for receiving the converted voltage from the power converter, and filters the converted voltage to generate a DC output voltage for receipt by the LED unit of each lamp.

6 Claims, 2 Drawing Sheets

LIGHTING SYSTEM

CROSS-REFERENCE TO RELATED APPLICATION

This application claims priority of Taiwanese Patent Application No. 106125026, filed on Jul. 26, 2017.

FIELD

The disclosure relates to lighting techniques, and more particularly to a lighting system.

BACKGROUND

A conventional lighting system is coupled to an alternating current (AC) power source, and includes a plurality of lamps. Each of the lamps includes a light emitting diode (LED) unit, and a power converting device that is coupled between the AC power source and the LED unit, and that converts an AC input voltage from the AC power source into a direct current (DC) output voltage for powering the LED unit.

For the conventional lighting system, a total number of the power converting devices increases with increasing total number of the lamps, and greater total number of the power converting devices leads to higher manufacturing cost and higher power consumption of the conventional lighting system. Moreover, for each of the lamps, heat generated during operation of the power converting device increases internal temperature of the lamp and reduces service life of the LED unit.

SUMMARY

Therefore, an object of the disclosure is to provide a lighting system that can alleviate at least one drawback of the prior art.

According to the disclosure, the lighting system includes at least one lamp and a power converting device. Each of the at least one lamp includes a light emitting diode (LED) unit. The power converting device is disposed outside of each of the at least one lamp, is used to be coupled to an alternating current (AC) power source for receiving an AC input voltage therefrom, and is coupled further to the LED unit of each of the at least one lamp. The power converting device converts the AC input voltage into a direct current (DC) output voltage for receipt by the LED unit of each of the at least one lamp, and includes a first electromagnetic interference (EMI) filter, a power converter and a second EMI filter. The first EMI filter is used to be coupled to the AC power source for receiving the AC input voltage therefrom, and filters the AC input voltage to generate a filtered voltage. The power converter is coupled to the first EMI filter for receiving the filtered voltage therefrom, and performs AC to DC conversion on the filtered voltage to generate a converted voltage. The second EMI filter is coupled to the power converter for receiving the converted voltage therefrom, is coupled further to the LED unit of each of the at least one lamp, and filters the converted voltage to generate the DC output voltage for receipt by the LED unit of each of the at least one lamp.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
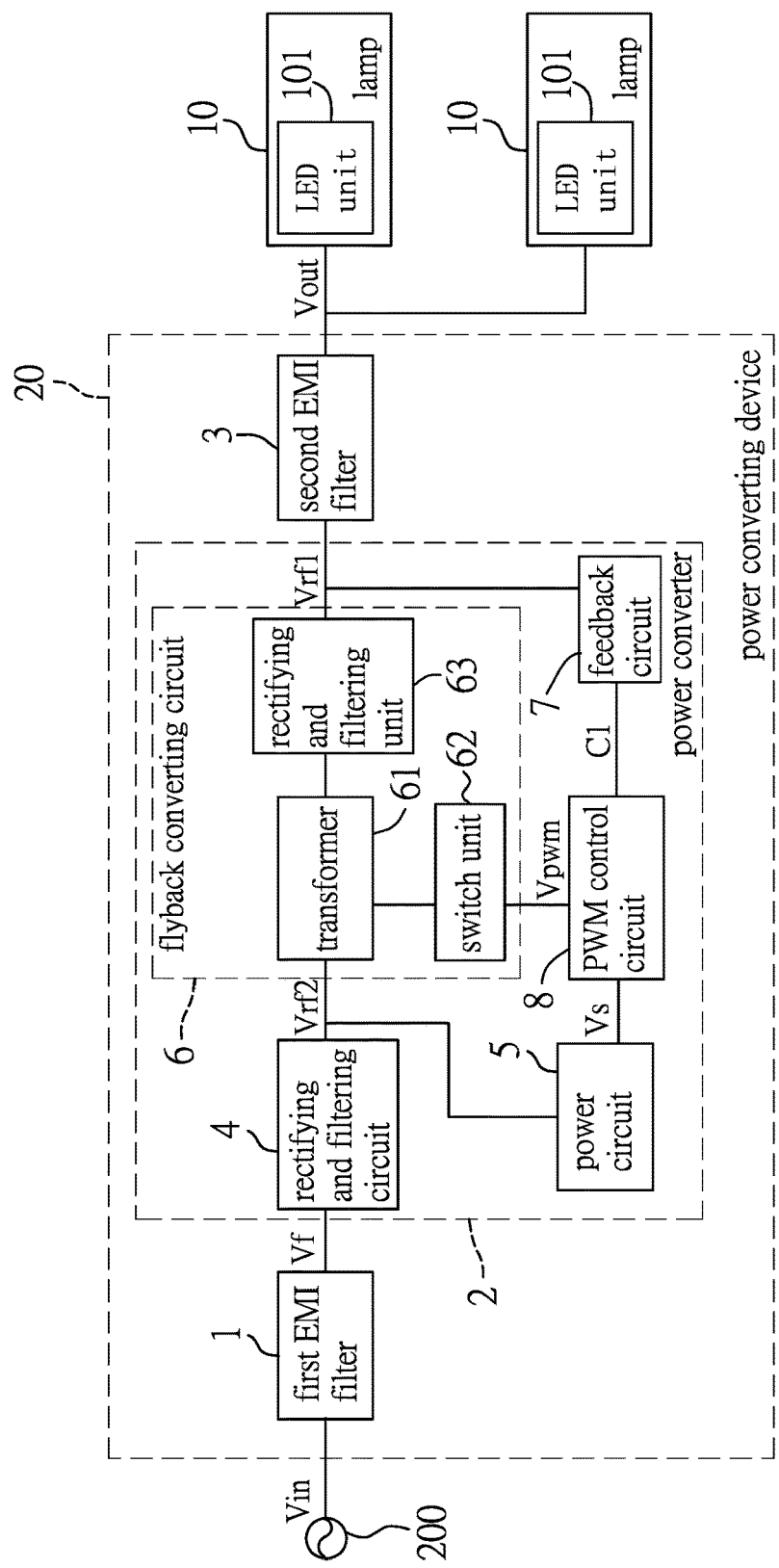
FIG. 1 is a block diagram illustrating an embodiment of a lighting system according to the disclosure.

Referring to FIG. 1, an embodiment of a lighting system according to the disclosure includes a number (N) of lamps 10 and a power converting device 20, where N is an integer greater than or equal to one. For illustration purposes, N=2 in this embodiment. Each of the lamps 10 includes a light emitting diode (LED) unit 101. The power converting device 20 is disposed outside of each of the lamps 10, is used to be coupled to an alternating current (AC) power source 200 for receiving an AC input voltage (Vin) therefrom, and is coupled further to the LED unit 101 of each of the lamps 10. The power converting device 20 converts the AC input voltage (Vin) into a direct current (DC) output voltage (Vout) for receipt by the LED unit 101 of each of the lamps 10 to emit light.

Figure 2:
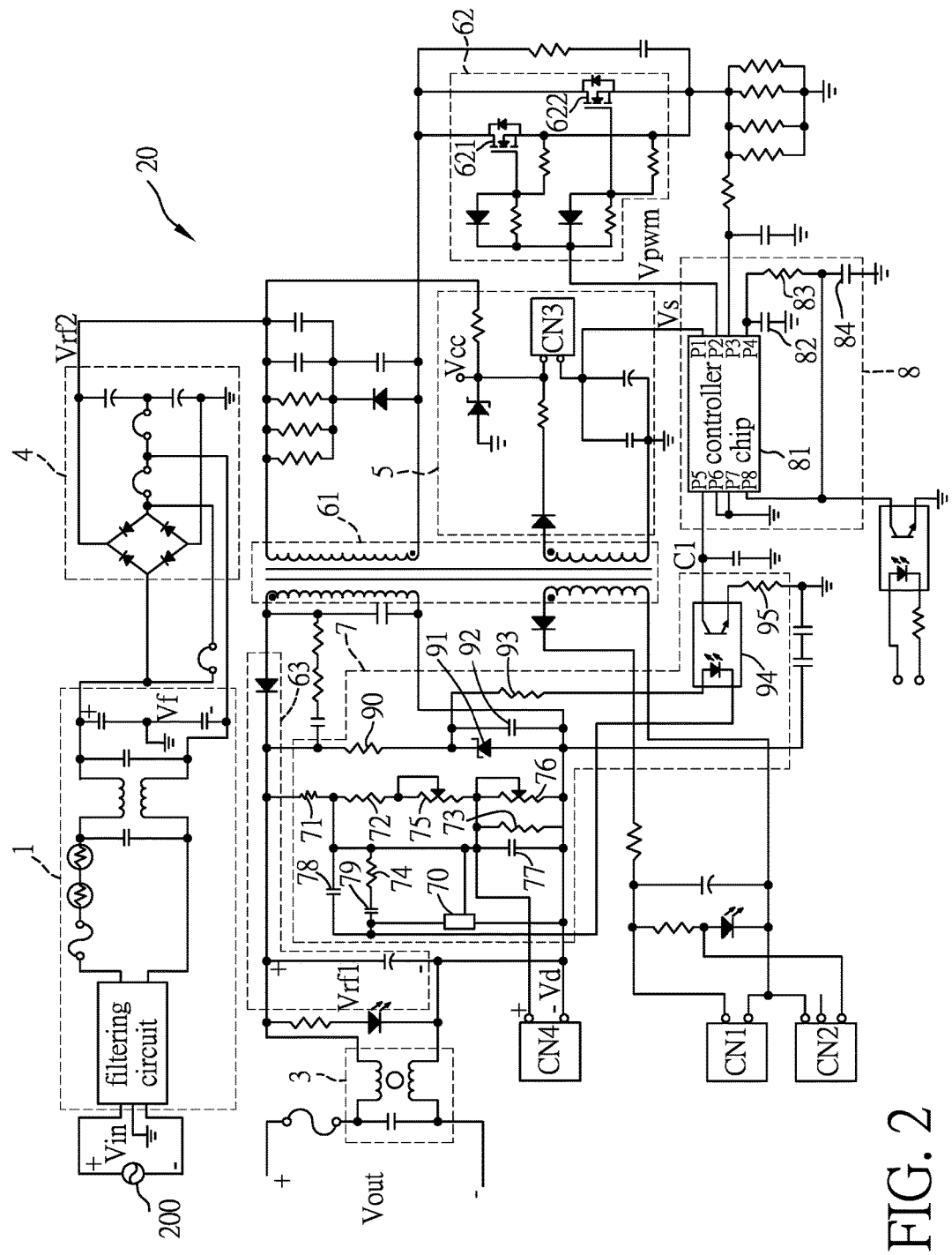
FIG. 2 is a circuit block diagram illustrating a power converting device of the embodiment.

Referring to FIGS. 1 and 2, in this embodiment, the power converting device 20 includes a first electromagnetic interference (EMI) filter 1, a power converter 2 and a second EMI filter 3. The first EMI filter 1 is used to be coupled to the AC power source 200 for receiving the AC input voltage (Vin) therefrom, and filters the AC input voltage (Vin) to generate a filtered voltage (Vf). The power converter 2 is coupled to the first EMI filter 1 for receiving the filtered voltage (Vf) therefrom, and performs AC to DC conversion on the filtered voltage (Vf) to generate a converted voltage (Vrf1). The second EMI filter 3 is coupled to the power converter 2 for receiving the converted voltage (Vrf1) therefrom, is coupled further to the LED unit 101 of each of the lamps 10, and filters the converted voltage (Vrf1) to generate the DC output voltage (Vout) for receipt by the LED unit 101 of each of the lamps 10. Exemplary implementation of each of the first and second EMI filters 1, 3 is as shown in FIG. 2.

In this embodiment, the power converter 2 includes a rectifying and filtering circuit 4, a power circuit 5, a flyback converting circuit 6, a feedback circuit 7 and a pulse width modulation (PWM) control circuit 8.

The rectifying and filtering circuit 4 is coupled to the first EMI filter 1 for receiving the filtered voltage (Vf) therefrom, and rectifies and filters the filtered voltage (Vf) to generate a rectified voltage (Vrf2). Exemplary implementation of the rectifying and filtering circuit 4 is as shown in FIG. 2.

The power circuit 5 is coupled to the rectifying and filtering circuit 4 for receiving the rectified voltage (Vrf2) therefrom, and generates a supply voltage (Vs) based on the rectified voltage (Vrf2). Exemplary implementation of the power circuit 5 is as shown in FIG. 2.

The flyback converting circuit 6 is coupled to the rectifying and filtering circuit 4 for receiving the rectified voltage (Vrf2) therefrom, is coupled further to the second EMI filter 3, and further receives a PWM signal (Vpwm). The flyback converting circuit 6 performs DC to DC conversion on the rectified voltage (Vrf2) based on the PWM signal (Vpwm) to generate the converted voltage (Vrf1) for receipt by the second EMI filter 3. In this embodiment, the flyback converting circuit 6 includes a transformer 61, a switch unit 62 and a rectifying and filtering unit 63. The transformer 61 is coupled to the rectifying and filtering circuit 4 for receiving the rectified voltage (Vrf2) therefrom. The switch unit 62 is coupled to the transformer 61, receives the PWM signal (Vpwm), and switches between an ON state and an OFF state based on the PWM signal (Vpwm), so that the rectified voltage (Vrf2) is converted by the transformer 61 into an AC intermediate voltage. The rectifying and filtering unit 63 is coupled to the transformer 61 for receiving the AC intermediate voltage therefrom, and rectifies and filters the AC intermediate voltage to generate the converted voltage (Vrf1). Exemplary implementation of each of the transformer 61, the switch unit 62 and the rectifying and filtering unit 63 is as shown in FIG. 2.

The feedback circuit 7 is coupled to the rectifying and filtering unit 63 for receiving the converted voltage (Vrf1) therefrom, and generates, based on the converted voltage (Vrf1) and a scaling factor, a feedback signal (C1) related to a product of a magnitude of the converted voltage (Vrf1) and the scaling factor. In this embodiment, the feedback circuit 7 includes a first resistor 71, a second resistor 72, a third resistor 75, a fourth resistor 76, a fifth resistor 73, a first capacitor 77, a voltage regulator 70, a second capacitor 78, a sixth resistor 74, a third capacitor 79, a seventh resistor 90, a Zener diode 91, a fourth capacitor 92, an eighth resistor 93, an opto-isolator 94 and a ninth resistor 95. The first resistor 71 has a first terminal that is coupled to the rectifying and filtering unit 63 for receiving the converted voltage (Vrf1) therefrom, and a second terminal. The second resistor 72 has a first terminal that is coupled to the second terminal of the first resistor 71, and a second terminal. The third resistor 75 has a first terminal that is coupled to the second terminal of the second resistor 72, and a second terminal that is coupled to the second terminal of the first resistor 71. The fourth resistor 76 has a first terminal that is coupled to the second terminal of the first resistor 71, and a second terminal. The fifth resistor 73 is coupled to the fourth resistor 76 in parallel. The first capacitor 77 is coupled to the fourth resistor 76 in parallel. The voltage regulator 70 is an adjustable shunt regulator of a TL431 type, and has a first terminal, a second terminal that is coupled to the second terminal of the fourth resistor 76, and a third terminal that is coupled to the second terminal of the first resistor 71. The second capacitor 78 is coupled between the second terminal of the first resistor 71 and the first terminal of the voltage regulator 70. The sixth resistor 74 and the third capacitor 79 are coupled in series between the second terminal of the first resistor 71 and the first terminal of the voltage regulator 70, with the sixth resistor 74 coupled to the second terminal of the first resistor 71 and the third capacitor 79 coupled to the first terminal of the voltage regulator 70. The seventh resistor 90 has a first terminal that is coupled to the first terminal of the first resistor 71, and a second terminal. The Zener diode 91 has an anode that is coupled to the second terminal of the fourth resistor 76, and a cathode that is coupled to the second terminal of the seventh resistor 90. The fourth capacitor 92 is coupled to the Zener diode 91 in parallel. The eighth resistor 93 has a first terminal that is coupled to the second terminal of the seventh resistor 90, and a second terminal. The opto-isolator 94 has an anode that is coupled to the second terminal of the eighth resistor 93, a cathode that is coupled to the first terminal of the voltage regulator 70, a collector and an emitter. The ninth resistor 95 is coupled between the emitter of the opto-isolator 94 and ground. Each of the first, second, fifth, sixth, seventh, eighth and ninth resistors 71, 72, 73, 74, 90, 93, 95 has a fixed resistance. Each of the third and fourth resistors 75, 76 has a variable resistance. The voltage regulator 70 generates, based on a voltage (Vd) at the third terminal thereof, a current at the first terminal thereof. The opto-isolator 94 generates, based on the current generated by the voltage regulator 70, the feedback signal (C1) at the collector thereof. Therefore, the scaling factor is determined by the resistances of the first, fourth and fifth resistors 71, 76, 73; the voltage (Vd) has a magnitude equaling the product of the magnitude of the converted voltage (Vrf1) and the scaling factor; and each of a magnitude of the current generated by the voltage regulator 70 and a current magnitude of the feedback signal (C1) is correlated to the product of the magnitude of the converted voltage (Vrf1) and the scaling factor.

The PWM control circuit 8 is coupled to the power circuit 5 for being powered by the supply voltage (Vs) therefrom, is coupled further to the collector of the opto-isolator 94 for receiving the feedback signal (C1) therefrom, is coupled further to the switch unit 62, and generates the PWM signal (Vpwm) based on the feedback signal (C1) for receipt by the switch unit 62. In this embodiment, the PWM control circuit 8 includes a controller chip 81, a first capacitor 82, a resistor 83 and a second capacitor 84. The controller chip 81 is a current mode PWM controller chip of a UC3845 type, and has a first terminal (P1) that is coupled to the power circuit 5 for receiving the supply voltage (Vs) therefrom, a second terminal (P2) that is coupled to the switch unit 62, a third terminal (P3), a fourth terminal (P4), a fifth terminal (P5) that is coupled to the collector of the opto-isolator 94 for receiving the feedback signal (C1) therefrom, a sixth terminal (P6), a seventh terminal (P7) and an eighth terminal (P8). The first capacitor 82 is coupled between the fourth terminal (P4) of the controller chip 81 and ground. The resistor 83 is coupled between the fourth and eighth terminals (P4, P8) of the controller chip 81. The second capacitor 84 is coupled between the eighth terminal (P8) of the controller chip 81 and ground. The controller chip 81 generates a reference voltage at the fourth terminal (P4) thereof, and generates, at the second terminal (P2) thereof, the PWM signal (Vpwm) that has a frequency related to a resistance of the resistor 83 and a capacitance of the second capacitor 84, and that has a pulse width related to the feedback signal (C1). The pulse width of the PWM signal (Vpwm) is modulated in such a way that a magnitude of the DC output voltage (Vout) is stabilized at a value equaling a product of a magnitude of a reference voltage provided by the voltage regulator 70 and a reciprocal of the scaling factor.

It should be noted that an external resistor (not shown) with a variable resistance may be coupled to the fourth resistor 76 in parallel, so that the resistance of the external resistor may be adjusted by a user to change the scaling factor and thus the magnitude of the DC output voltage (Vout), thereby achieving dimming control of the LED units 101 of the lamps 10. For example, the magnitude of the DC output voltage (Vout) is stabilized at a value equaling one of 87V, 88V, 89V, 90V, . . . , and 120V.

In view of the above, the lighting system of this embodiment has the following advantages:

1. Since the LED units 101 of the lamps 10 are powered by the same device (i.e., the power converting device 20), a total number of the power converting device 20 does not increase with increasing total number (N) of the lamps 10, thereby achieving relatively low manufacturing cost and relatively low power consumption of the lighting system when the total number (N) of the lamps 10 is greater than one.

2. As the power converting device 20 is disposed outside of each of the lamps 10, internal temperature of each of the lamps 10 no longer increases due to heat generated by the power converting device 20 during operation, thereby prolonging service life of the LED unit 101 of each of the lamps 10.

3. The lighting system can be used with the external resistor to change the magnitude of the DC output voltage (Vout), thereby achieving dimming control of the LED units 101 of the lamps 10.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A lighting system comprising:
   at least one lamp each including a light emitting diode (LED) unit; and
   a power converting device disposed outside of each of said at least one lamp, used to be coupled to an alternating current (AC) power source for receiving an AC input voltage therefrom, and coupled further to said LED unit of each of said at least one lamp, said power converting device converting the AC input voltage into a direct current (DC) output voltage for receipt by said LED unit of each of said at least one lamp, and including
      a first electromagnetic interference (EMI) filter used to be coupled to the AC power source for receiving the AC input voltage therefrom, and filtering the AC input voltage to generate a filtered voltage;
      a power converter coupled to said first EMI filter for receiving the filtered voltage therefrom, and performing AC to DC conversion on the filtered voltage to generate a converted voltage; and
      a second EMI filter coupled to said power converter for receiving the converted voltage therefrom, coupled further to said LED unit of each of said at least one lamp, and filtering the converted voltage to generate the DC output voltage for receipt by said LED unit of each of said at least one lamp,
   wherein said power converter includes:
      a rectifying and filtering circuit coupled to said first EMI filter for receiving the filtered voltage therefrom, and rectifying and filtering the filtered voltage to generate a rectified voltage;
      a flyback converting circuit coupled to said rectifying and filtering circuit for receiving the rectified voltage therefrom, coupled further to said second EMI filter, and further receiving a pulse width modulation (PWM) signal, said flyback converting circuit performing DC to DC conversion on the rectified voltage based on the PWM signal to generate the converted voltage for receipt by said second EMI filter;
      a feedback circuit coupled to said flyback converting circuit for receiving the converted voltage therefrom, and generating, based on the converted voltage and a scaling factor, a feedback signal related to a product of a magnitude of the converted voltage and the scaling factor; and
      a PWM control circuit coupled to said feedback circuit for receiving the feedback signal therefrom, coupled further to said flyback converting circuit, and generating the PWM signal based on the feedback signal for receipt by said flyback converting circuit, and
   wherein said feedback circuit includes:
      a first resistor having a first terminal that is coupled to said flyback converting circuit for receiving the converted voltage therefrom, and a second terminal;
      a second resistor having a first terminal that is coupled to said second terminal of said first resistor, and a second terminal;
      a third resistor having a first terminal that is coupled to said second terminal of said second resistor, and a second terminal that is coupled to said second terminal of said first resistor;
      a fourth resistor having a first terminal that is coupled to said second terminal of said first resistor, and a second terminal;
      a fifth resistor coupled to said fourth resistor in parallel;
      a first capacitor coupled to said fourth resistor in parallel;
      a voltage regulator having a first terminal, a second terminal that is coupled to said second terminal of said fourth resistor, and a third terminal that is coupled to said second terminal of said first resistor;
      a second capacitor coupled between said second terminal of said first resistor and said first terminal of said voltage regulator; and
      a sixth resistor and a third capacitor coupled in series between said second terminal of said first resistor and said first terminal of said voltage regulator; and
      said voltage regulator generating, at said first terminal thereof and based on a voltage at said third terminal thereof, a current corresponding to the feedback signal.

2. The lighting system of claim 1, wherein said power converter further includes:
   a power circuit coupled to said rectifying and filtering circuit for receiving the rectified voltage therefrom, coupled further to said PWM control circuit, and generating a supply voltage based on the rectified voltage for powering said PWM control circuit.

3. The lighting system of claim 1, wherein each of said first, second, fifth and sixth resistors has a fixed resistance, and each of said third and fourth resistors has a variable resistance.

4. The lighting system of claim 1, wherein said PWM control circuit includes:
   a controller chip having a first terminal, a second terminal that is coupled to said flyback converting circuit, a third terminal, a fourth terminal, a fifth terminal that is coupled to said feedback circuit for receiving the feedback signal therefrom, a sixth terminal, a seventh terminal and an eighth terminal;
   a first capacitor coupled between said fourth terminal of said controller chip and ground;
   a resistor coupled between said fourth and eighth terminals of said controller chip; and
   a second capacitor coupled between said eighth terminal of said controller chip and ground;

said controller chip generating a reference voltage at said fourth terminal thereof, and generating, at said second terminal thereof, the PWM signal that has a frequency related to a resistance of said resistor and a capacitance of said second capacitor, and that has a pulse width related to the feedback signal.

5. The lighting system of claim 4, wherein said controller chip is a current mode PWM controller chip.

6. A lighting system comprising:
at least one lamp each including a light emitting diode (LED) unit; and
a power converting device disposed outside of each of said at least one lamp, used to be coupled to an alternating current (AC) power source for receiving an AC input voltage therefrom, and coupled further to said LED unit of each of said at least one lamp, said power converting device converting the AC input voltage into a direct current (DC) output voltage for receipt by said LED unit of each of said at least one lamp, and including
a first electromagnetic interference (EMI) filter used to be coupled to the AC power source for receiving the AC input voltage therefrom, and filtering the AC input voltage to generate a filtered voltage;
a power converter coupled to said first EMI filter for receiving the filtered voltage therefrom, and performing AC to DC conversion on the filtered voltage to generate a converted voltage; and
a second EMI filter coupled to said power converter for receiving the converted voltage therefrom, coupled further to said LED unit of each of said at least one lamp, and filtering the converted voltage to generate the DC output voltage for receipt by said LED unit of each of said at least one lamp,
wherein said power converter includes:
a rectifying and filtering circuit coupled to said first EMI filter for receiving the filtered voltage therefrom, and rectifying and filtering the filtered voltage to generate a rectified voltage;
a flyback converting circuit coupled to said rectifying and filtering circuit for receiving the rectified voltage therefrom, coupled further to said second EMI filter, and further receiving a pulse width modulation (PWM) signal, said flyback converting circuit performing DC to DC conversion on the rectified voltage based on the PWM signal to generate the converted voltage for receipt by said second EMI filter;
a feedback circuit coupled to said flyback converting circuit for receiving the converted voltage therefrom, and generating, based on the converted voltage and a scaling factor, a feedback signal related to a product of a magnitude of the converted voltage and the scaling factor; and
a PWM control circuit coupled to said feedback circuit for receiving the feedback signal therefrom, coupled further to said flyback converting circuit, and generating the PWM signal based on the feedback signal for receipt by said flyback converting circuit, and
wherein said PWM control circuit includes:
a controller chip having a first terminal, a second terminal that is coupled to said flyback converting circuit, a third terminal, a fourth terminal, a fifth terminal that is coupled to said feedback circuit for receiving the feedback signal therefrom, a sixth terminal, a seventh terminal and an eighth terminal;
a first capacitor coupled between said fourth terminal of said controller chip and ground;
a resistor coupled between said fourth and eighth terminals of said controller chip; and
a second capacitor coupled between said eighth terminal of said controller chip and ground; and
said controller chip generating a reference voltage at said fourth terminal thereof, and generating, at said second terminal thereof, the PWM signal that has a frequency related to a resistance of said resistor and a capacitance of said second capacitor, and that has a pulse width related to the feedback signal.

* * * * *